US012092715B2

(12) United States Patent
Ersoz

(10) Patent No.: US 12,092,715 B2
(45) Date of Patent: Sep. 17, 2024

(54) MAGNETIC RESONANCE IMAGING SYSTEM AND METHOD

(71) Applicant: GE Precision Healthcare LLC, Wauwatosa, WI (US)

(72) Inventor: Ali Ersoz, Wauwatosa, WI (US)

(73) Assignee: GE Precision Healthcare LLC, Wauwatosa, WI (US)

( * ) Notice: Subject to any disclaimer, the term of this patent is extended or adjusted under 35 U.S.C. 154(b) by 147 days.

(21) Appl. No.: 18/067,939

(22) Filed: Dec. 19, 2022

(65) Prior Publication Data

US 2024/0201298 A1   Jun. 20, 2024

(51) Int. Cl.
*G01R 33/48* (2006.01)
*G01R 33/565* (2006.01)

(52) U.S. Cl.
CPC ... *G01R 33/4822* (2013.01); *G01R 33/56509* (2013.01)

(58) Field of Classification Search
CPC .............. G01R 33/4822; G01R 33/56509
See application file for complete search history.

(56) References Cited

U.S. PATENT DOCUMENTS

| 9,322,894 | B2 | 4/2016 | Gui | |
|---|---|---|---|---|
| 9,918,639 | B2 * | 3/2018 | Cetingul | A61B 5/24 |
| 10,120,048 | B2 * | 11/2018 | Koktzoglou | G01R 33/4824 |
| 2020/0300952 | A1 * | 9/2020 | Doneva | G01R 33/567 |

OTHER PUBLICATIONS

Feng et al. "XD-GRASP: Golden-angle radial MRI with reconstruction of extra motion-state dimensions using compressed sensing." Magnetic resonance in medicine vol. 75,2 (2016): 775-88, 25 pages.
Johnson et al. "Improved least squares MR image reconstruction using estimates of k-space data consistency." Magnetic resonance in medicine vol. 67,6 (2012): 1600-8, 18 pages.
Lv et al. "Respiratory motion correction for free-breathing 3D abdominal MRI using CNN-based image registration: a feasibility study." The British journal of radiology vol. 91,1083 (2018): 20170788, 9 pages.
Zhang et al. "Fast pediatric 3D free-breathing abdominal dynamic contrast enhanced MRI with high spatiotemporal resolution." Journal of magnetic resonance imaging : JMRI vol. 41,2 (2015): 460-73, 30 pages.

* cited by examiner

*Primary Examiner* — Gregory H Curran

(57) ABSTRACT

A method for generating an image of an object with a magnetic resonance imaging (MRI) system includes acquiring an initial set of radial k-space spokes. Based on the initial set of radial k-space spokes, a plurality of motion states of the object is estimated. A first set of radial k-space spokes are then acquired based on a pre-defined view order sequence. Based on the first set of radial k-space spokes, a motion of the object is determined. If the object motion is detected, then the pre-defined view order is adjusted. A second set of radial k-space spokes is then acquired based on the adjusted pre-defined view order. The MRI k-space is generated by distributing the radial k-space spokes having similar motion evenly across the MRI k-space. Finally, the image of the object is reconstructed based on the MRI k-space.

22 Claims, 8 Drawing Sheets

MAGNETIC RESONANCE IMAGING SYSTEM AND METHOD

BACKGROUND

Embodiments disclosed in the present invention relate to medical imaging technologies, and more specifically to a method for obtaining magnetic resonance imaging (MRI) data and a magnetic resonance imaging system.

As a medical imaging modality, Magnetic resonance imaging (MRI), can obtain images of the human body without using X-rays or other ionizing radiation. MRI uses a magnet having a strong magnetic field to generate a static magnetic field B0. When a part of the human body to be imaged is positioned in the static magnetic field B0, nuclear spin associated with hydrogen nuclei in human tissue is polarized, so that the tissue of the to-be-imaged part generates a longitudinal magnetization vector at a macroscopic level. After a radio-frequency field B1 intersecting the direction of the static magnetic field B0 is applied, the direction of rotation of protons changes so that the tissue of the to-be-imaged part generates a transverse magnetization vector at a macroscopic level. After the radio-frequency field B1 is removed, the transverse magnetization vector decays in a spiral manner until it is restored to zero. A free induction decay signal is generated during decay. The free induction decay signal can be acquired as a magnetic resonance signal, and a tissue image of the to-be-imaged part can be reconstructed based on the acquired signal.

During MRI acquisition, patient motion affects the quality of the image. Techniques have been developed to perform MRI imaging sequences to correct for patient motion, such as to avoid long breath holds required of patients and to correct for voluntary/involuntary patient movement. However, current techniques for such correction are often inadequate or subject to further improvement. For example, Radial Stack-of-Stars (SoS) imaging with hard or soft gating is one such technique. Such techniques might further employ view-ordering methods such as golden-angle or interleaved method. However, in some cases, these methods end up having corrupted signal due to patient motion localized in some regions of the MRI k-Space resulting in inferior image quality. Accordingly, it is now recognized that a need exists for improved methods for data acquisition and reconstruction in magnetic resonance imaging techniques that are sensitive to patient motion.

Therefore, there is a need for an improved data acquisition and reconstruction technique for the magnetic resonance imaging system and method.

BRIEF DESCRIPTION

In accordance with an embodiment of the present technique, a method for generating an image of an object with a magnetic resonance imaging (MRI) system is provided. The method includes acquiring an initial set of radial k-space spokes and estimating a plurality of motion states of the object based on the initial set of radial k-space spokes. The method further includes acquiring a first set of radial k-space spokes based on a pre-defined view order sequence and estimating a motion of the object based on the first set of radial k-space spokes. The method also includes adjusting the pre-defined view order if the motion of the object is detected and acquiring a second set of radial k-space spokes based on the adjusted pre-defined view order. Moreover, the method includes generating an MRI k-space by distributing the radial k-space spokes having similar motion evenly across the MRI k-space and reconstructing the image of the object based on the MRI k-space.

In accordance with another embodiment of the present technique, a magnetic resonance imaging (MRI) system having a magnet configured to generate a polarizing magnetic field about at least a portion of an object arranged in the MRI system is provided. The MRI system includes a gradient coil assembly including a readout gradient coil, a phase gradient coil, a slice selection gradient coil configured to apply at least one gradient field to the polarizing magnetic field and a radio frequency (RF) system configured to apply an RF field to the object and to receive magnetic resonance signals from the object. The MRI system also includes a processing system programmed to acquire an initial set of radial k-space spokes and to estimate a plurality of motion states of the object based on the initial set of radial k-space spokes. The processing system is also programmed to acquire a first set of radial k-space spokes based on a pre-defined view order sequence and to estimate a motion of the object based on the first set of radial k-space spokes. The processing system is further programmed to adjust the pre-defined view order if the motion of the object is detected and to acquire a second set of radial k-space spokes based on the adjusted pre-defined view order. Moreover, the processing system is programmed to generate an MRI k-space by distributing the radial k-space spokes having similar motion evenly across the MRI k-space and to reconstruct the image of the object based on the MRI k-space.

In accordance with yet another embodiment of the present technique, a method for generating an image of an object with a magnetic resonance imaging (MRI) system is presented. The method includes estimating a plurality of motion states of the object based on an initial set of radial k-space spokes and acquiring MRI radial k-space spokes for generating a MRI k-space. The method further includes estimating a motion of the object from at least one of the MRI radial k-space spokes and adjusting a view order of acquiring the MRI radial k-space spokes based on the detected motion of the object. The method also includes generating the MRI k-space by distributing the radial MRI k-space spokes having similar motion evenly across the MRI k-space; and reconstructing the image of the object based on the MRI k-space.

DRAWINGS

These and other features, aspects, and advantages of the present invention will become better understood when the following detailed description is read with reference to the accompanying drawings in which like characters represent like parts throughout the drawings, wherein.

DETAILED DESCRIPTION

Figure 1:
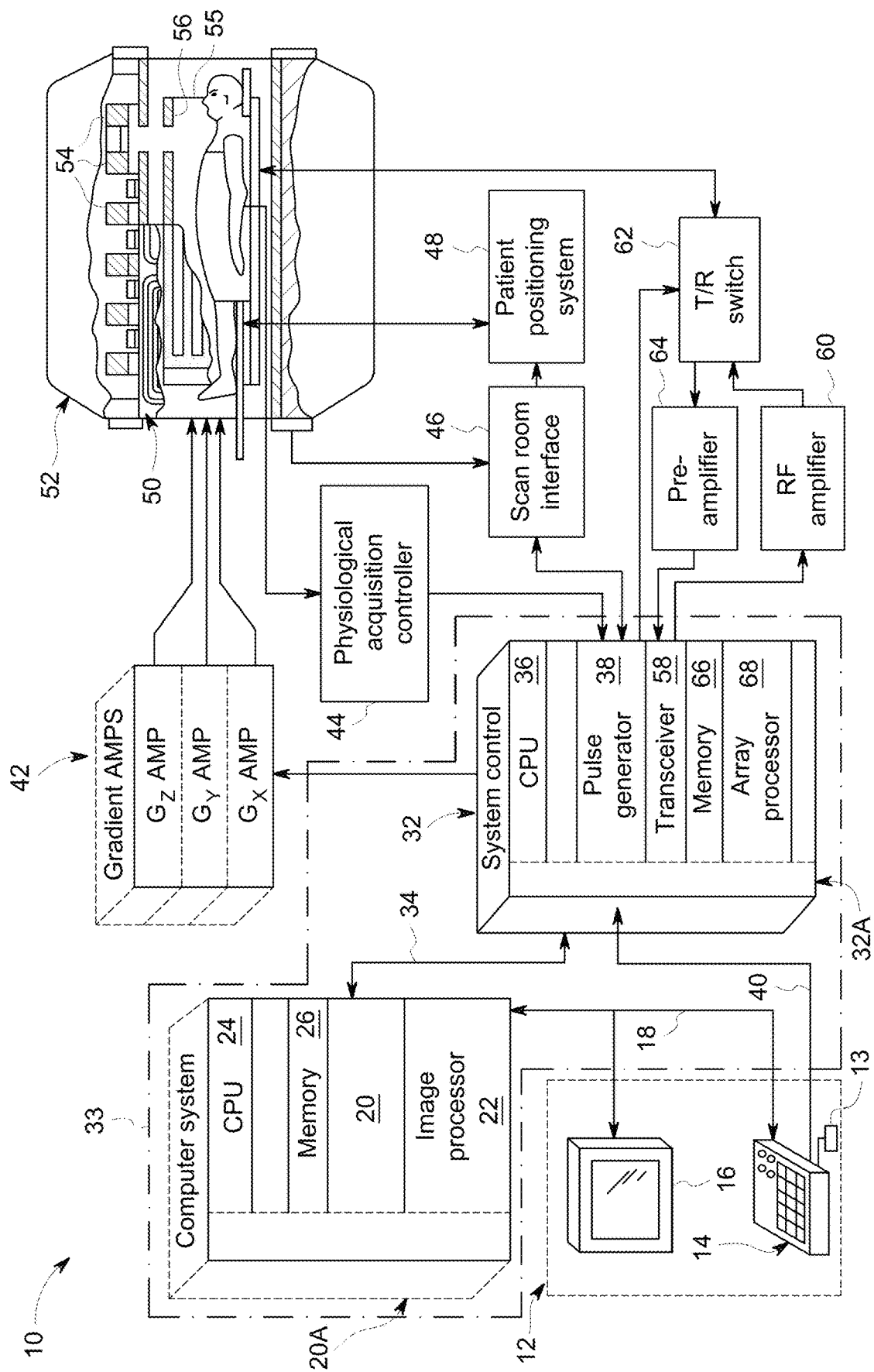
FIG. 1 is a schematic diagram of an exemplary magnetic resonance imaging (MRI) system, in accordance with an embodiment of the present technique.

One or more specific embodiments will be described below. In an effort to provide a concise description of these embodiments, all features of an actual implementation may not be described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present embodiments, the articles "a," "an," "the," and "said" are intended to mean that there are one or more of the elements. The terms "comprising," "including," and "having" are intended to be inclusive and mean that there may be additional elements other than the listed elements. Furthermore, any numerical examples in the following discussion are intended to be non-limiting, and thus additional numerical values, ranges, and percentages are within the scope of the disclosed embodiments. Furthermore, the terms "circuit" and "circuitry" and "controller" may include either a single component or a plurality of components, which are either active and/or passive and are connected or otherwise coupled together to provide the described function.

In magnetic resonance imaging (MRI), an object is placed in a magnet. When the object is in the magnetic field generated by the magnet, magnetic moments of nuclei, such as protons, attempt to align with the magnetic field but process about the magnetic field in a random order at the nuclei's Larmor frequency. The magnetic field of the magnet is referred to as B0 and extends in the longitudinal or z direction. In acquiring a MR image, a magnetic field (referred to as an excitation field B1), which is in the x-y plane and near the Larmor frequency, is generated by a radio-frequency (RF) coil and may be used to rotate, or "flip," the net magnetic moment (or net magnetization) $M_z$ of the nuclei from the z direction to the transverse or x-y plane. This flip of the net magnetic moment $M_z$ of the nuclei is measured by a flip angle which is the amount of rotation the net magnetization experiences during the application of the RF pulse to the RF coil. A signal, which is referred to as a MR signal, is emitted by the nuclei, after the excitation signal B1 is terminated. To use the MR signals to generate an image of an object, magnetic field gradient pulses ($G_x$, $G_y$, and $G_z$) are used. The gradient pulses are used to scan through the k space, the space of spatial frequencies or inverse of distances. A Fourier relationship exists between the acquired MR signals and an image of the object, and therefore the image of the object can be derived by reconstructing the MR signals. The images of the object may include two dimensional (2D) or three-dimensional (3D) images.

Embodiments of the present disclosure will now be described, by way of an example, with reference to the figures, in which FIG. 1 is a schematic diagram of a magnetic resonance imaging (MRI) system 10. Operation of the system 10 may be controlled from an operator console 12, which includes an input device 13, a control panel 14, and a display screen 16. The input device 13 may be a mouse, joystick, keyboard, track ball, touch activated screen, light wand, voice control, and/or other input device. The input device 13 may be used for interactive geometry prescription. The console 12 communicates through a link 18 with a computer system 20 that enables an operator to control the production and display of images on the display screen 16. The link 18 may be a wireless or wired connection. The computer system 20 may include modules that communicate with each other through a backplane 20a. The modules of the computer system 20 may include an image processor module 22, a central processing unit (CPU) module 24, and a memory module 26 that may include a frame buffer for storing image data arrays, for example. The computer system 20 may be linked to archival media devices, permanent or back-up memory storage or a network for storage of image data and programs and communicates with MRI system control 32 through a high-speed signal link 34. The MRI system control 32 may be separate from or integral with the computer system 20. The computer system 20 and the MRI system control 32 collectively form an "MRI controller" 33 or "controller".

In the exemplary embodiment, the MRI system control 32 includes modules connected by a backplane 32a. These modules include a CPU module 36, as well as a pulse generator module 38. The CPU module 36 connects to the operator console 12 through a data link 40. The MRI system control 32 receives commands from the operator through the data link 40 to indicate the scan sequence that is to be performed. The CPU module 36 operates the system components to carry out the desired scan sequence and produces data which indicates the timing, strength and shape of the RF pulses produced, and the timing and length of the data acquisition window. The CPU module 36 connects to components that are operated by the MRI controller 32, including the pulse generator module 38 which controls a gradient amplifier 42, a physiological acquisition controller (PAC) 44, and a scan room interface circuit 46.

In one example, the CPU module 36 receives patient data from the physiological acquisition controller 44, which receives signals from sensors connected to the object, such as ECG signals received from electrodes attached to the patient. As used herein, an object is a human (or patient), an animal, or a phantom. The CPU module 36 receives, via the scan room interface circuit 46, signals from the sensors associated with the condition of the patient and the magnet system. The scan room interface circuit 46 also enables the MRI controller 33 to command a patient positioning system 48 to move the patient to a desired position for scanning.

A whole-body RF coil 56 is used for transmitting the waveform towards subject anatomy. The whole body-RF coil 56 may be a body coil. An RF coil may also be a local coil that may be placed in more proximity to the subject anatomy than a body coil. The RF coil 56 may also be a surface coil. RF coils containing RF receiver channels may be used for receiving the signals from the subject anatomy.

Typical surface coil would have eight receiving channels; however, different number of channels are possible. Using the combination of both a body coil 56 and a surface coil is known to provide better image quality.

The pulse generator module 38 may operate the gradient amplifiers 42 to achieve desired timing and shape of the gradient pulses that are produced during the scan. The gradient waveforms produced by the pulse generator module 38 may be applied to the gradient amplifier system 42 having Gx, Gy, and Gz amplifiers. Each gradient amplifier excites a corresponding physical gradient coil in a gradient coil assembly 50, to produce the magnetic field gradients used for spatially encoding acquired signals. Specifically, Gx corresponds to a flow/frequency encoding gradient, Gy corresponds to a phase encoding gradient and Gz corresponds to a slice select gradient. The gradient coil assembly 50 may form part of a magnet assembly 52, which also includes a polarizing magnet 54 (which, in operation, provides a longitudinal magnetic field $B_0$ throughout a target volume 55 that is enclosed by the magnet assembly 52 and a whole-body RF coil 56 (which, in operation, provides a transverse magnetic field B1 that is generally perpendicular to B0 throughout the target volume 55. A transceiver module 58 in the MRI system control 32 produces pulses that may be amplified by an RF amplifier 60 and coupled to the RF coil 56 by a transmit/receive switch 62. The resulting signals emitted by the excited nuclei in the subject anatomy may be sensed by receiving coils (not shown) and provided to a preamplifier 64 through the transmit/receive switch 62. The amplified MR signals are demodulated, filtered, and digitized in the receiver section of the transceiver 58. The transmit/receive switch 62 is controlled by a signal from the pulse generator module 38 to electrically connect the RF amplifier 60 to the coil 56 during the transmit mode and to connect the preamplifier 64 to the receiving coil during the receive mode.

The MR signals produced from excitation of the target are digitized by the transceiver module 58. The MR system control 32 then processes the digitized signals by Fourier transform to produce k-space data, which is transferred to a memory module 66, or other computer readable media, via the MRI system control 32. "Computer readable media" may include, for example, structures configured so that electrical, optical, or magnetic states may be fixed in a manner perceptible and reproducible by a conventional computer (e.g., text or images printed to paper or displayed on a screen, optical discs, or other optical storage media, "flash" memory, EEPROM, SDRAM, or other electrical storage media; floppy or other magnetic discs, magnetic tape, or other magnetic storage media).

A scan is complete when an array of raw k-space data has been acquired in the computer readable media 66. This raw k-space data is rearranged into separate k-space data arrays for each image to be reconstructed, and each of these k-space data arrays is input to an array processor 68, which operates to reconstruct the data into an array of image data, using a reconstruction algorithm such as a Fourier transform. When the full k-space data is obtained, it represents entire volume of the subject body and the k-space so obtained may be referred as the reference k-space. Similarly, when only the partial k-space data is obtained, the image may be referred as the partial k-space. This image data is conveyed through the data link 34 to the computer system 20 and stored in memory. In response to the commands received from the operator console 12, this image data may be archived in a long-term storage or may be further processed by the image processor 22 and conveyed to the operator console 12 and presented on the display 16.

MR signals are represented by complex numbers, where each location at the k-space is represented by a complex number, with I and Q quadrature MR signals being the real and imaginary components. Complex MR images may be reconstructed based on I and Q quadrature MR signals, using processes such as Fourier transform of the k-space MR data. Complex MR images are MR images with each pixel represented by a complex number, which also has a real component and an imaginary component. The magnitude M of the received MR signal may be determined as the square root of the sum of the squares of the I and Q quadrature components of the received MR signal as in Eq. (3) below:

$$M = \sqrt{I^2 + Q^2} \qquad (1)$$

and the phase $\phi$ of the received MR signal may also be determined as in eq. (2) below:

$$\phi = \tan^{-1}\left(\frac{Q}{I}\right) \qquad (2)$$

It should be noted that if the patient moves during the MR signal acquisition, the quality of the image will be affected. For example, every time the patient breaths in or breaths out, there is motion along superior-inferior (S-I) direction i.e., patient head to patient feet direction. To reduce the impact of patient motion on image quality, a radial MR acquisition (where multiple radial lines are acquired to fill the k-space) is preferred over the conventional cartesian MR acquisition (where horizontal lines from top to bottom of the k-space are acquired). In the radial MR acquisition, the image artifacts due to motion is distributed across the image unlike the cartesian MR acquisition. Moreover, in the radial MR acquisition, due to radial nature of the k-space lines, the center of the k-space is oversampled which allows for detection and correction for motion artifacts. Thus, the radial MR acquisition allows free breathing for patients during the acquisition.

A plurality of view-ordering methods is associated with the radial MR acquisition. The view ordering method refers to a sequence in which radial k-space lines (also called as spokes) are acquired. The examples of conventional view-ordering methods include a golden-angle view ordering method or interleaved view ordering method. In some cases, these conventional view-ordering methods end up having corrupted signal due to patient motion in some regions of the MRI k-Space resulting in inferior image quality.

In accordance with an embodiment of the technique, a smart view order for radial MR acquisition is proposed. The technique employs estimating the patient motion from each k-space spoke or a subset of k-space spokes in real time and adjusting view order (spoke acquiring sequence) on the fly so that k-space spokes with similar motion state are distributed more evenly in k-Space.

Figure 2:
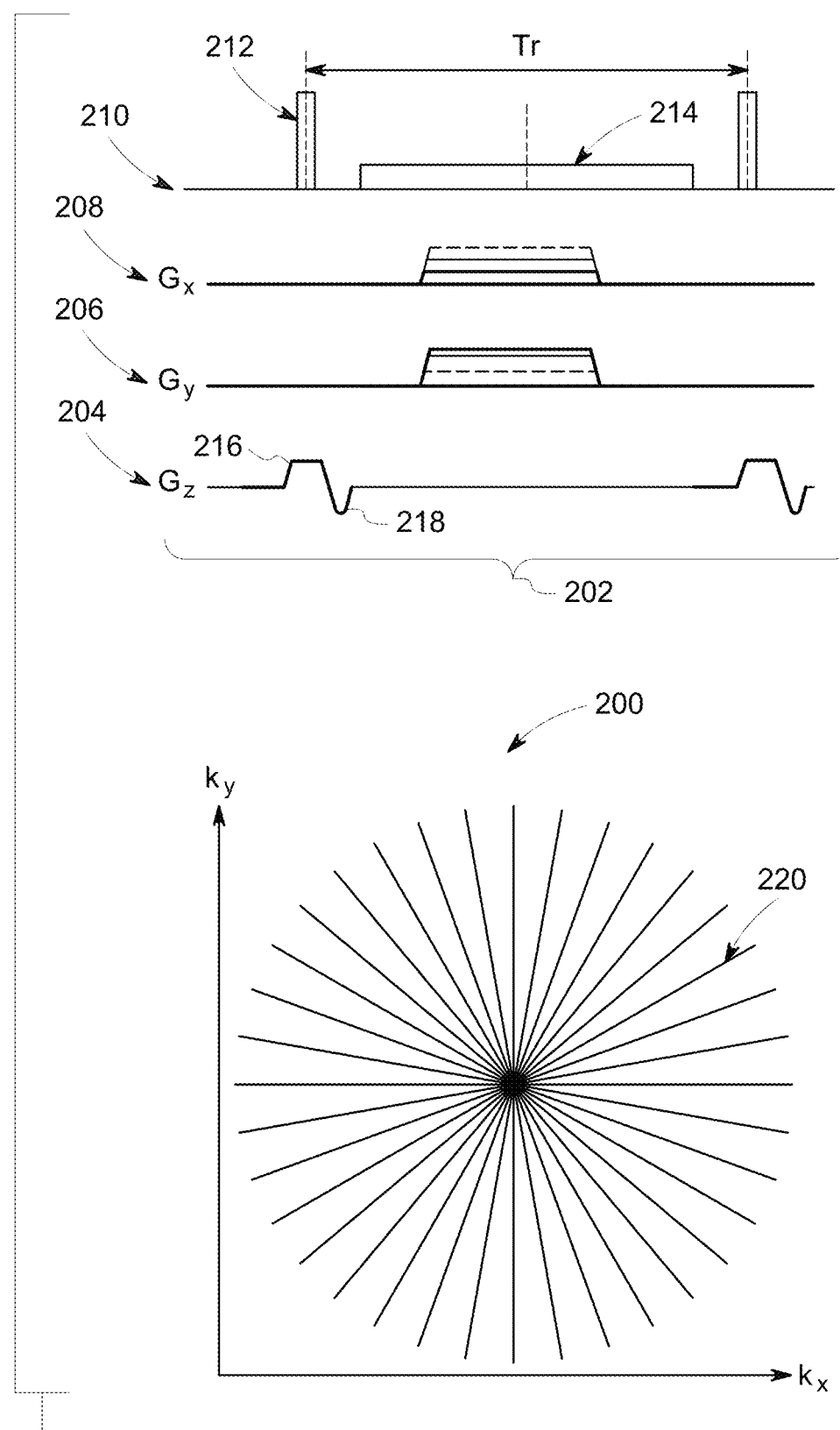
FIG. 2 is a schematic diagram of a radial k-space trajectory and a corresponding pulse sequence diagram, in accordance with an embodiment of the present technique.

FIG. 2 is a schematic diagram of a radial k-space trajectory 200 and a corresponding pulse sequence diagram 202. It should be noted that the radial k-space trajectory 200 is a 2 dimensional (2D) k-space trajectory. In general, k-space 200 represents raw data directly obtained from the MR signal wherein the k-space kx-ky values correspond to spatial frequencies of the MR image. The pulse sequences diagram 202 may be generated by different modules of MRI system control 32 of FIG. 1.

Plot 208 and plot 206 show readout gradient waveforms Gx and Gy, respectively. Plot 204 shows a slice selection gradient waveform Gz. Each of the gradient waveforms 204, 206 and 208 excites a corresponding physical gradient coil in a gradient coil assembly 50. Further, plot 210 shows RF signal waveform which excites RF coil 56 and generates a corresponding echo signal (or MR signal). The RF signal waveform 210 includes RF pulses 212 that are repeated at a time interval TR (Repetition time).

With each repetition TR, a k-space line 220 (also called a radial spoke) of the k-space 200 is filled. Moreover, each k-space line 220 passes through the center of the k-space 200. In other words, the k-space 200 is sampled with radial spokes that pass through the center of k-space 200.

The Gx readout gradient waveform 208 is applied with a different amplitude (indicated by the horizontal hatchmarks/dash lines) for each repetition time TR of the pulse sequence. Similarly, the Gy readout gradient 206 is applied with a different amplitude (indicated by the horizontal hatchmarks/dash lines) for each repetition time TR of the pulse sequence to acquire a different k-space line (or spoke) on each repetition. It should also be noted that as shown in FIG. 2, Gy readout gradient waveform 206 and Gx readout gradient waveform 206 are applied simultaneously during each repetition time TR. In general, the amplitudes of Gy readout gradient 206 and Gx readout gradient 208 determine which spoke 220 of the k-space 200 gets filled. The sequence in which you fill the k-space spoke is referred to as the view order. In one embodiment of the present technique, a smart view order is presented that detects the patient motion after acquisition of a subset of k-space spokes 220 and then based on the motion state, determines which k-space spoke to fill next.

The slice selection gradient signal waveform 204 has one upward lobe 216 called as the main slice-select gradient and one downward lobe 218 which is called as a slice rephasing lobe. The slice rephasing lobe 218 is applied right after the RF signal pulse 212. As will be appreciated by those skilled in the art, the slice-rephasing lobe 218 helps correct for the phase dispersion of transverse magnetization that occurs concomitant with application of the main slice-select gradient 218.

Figure 3:
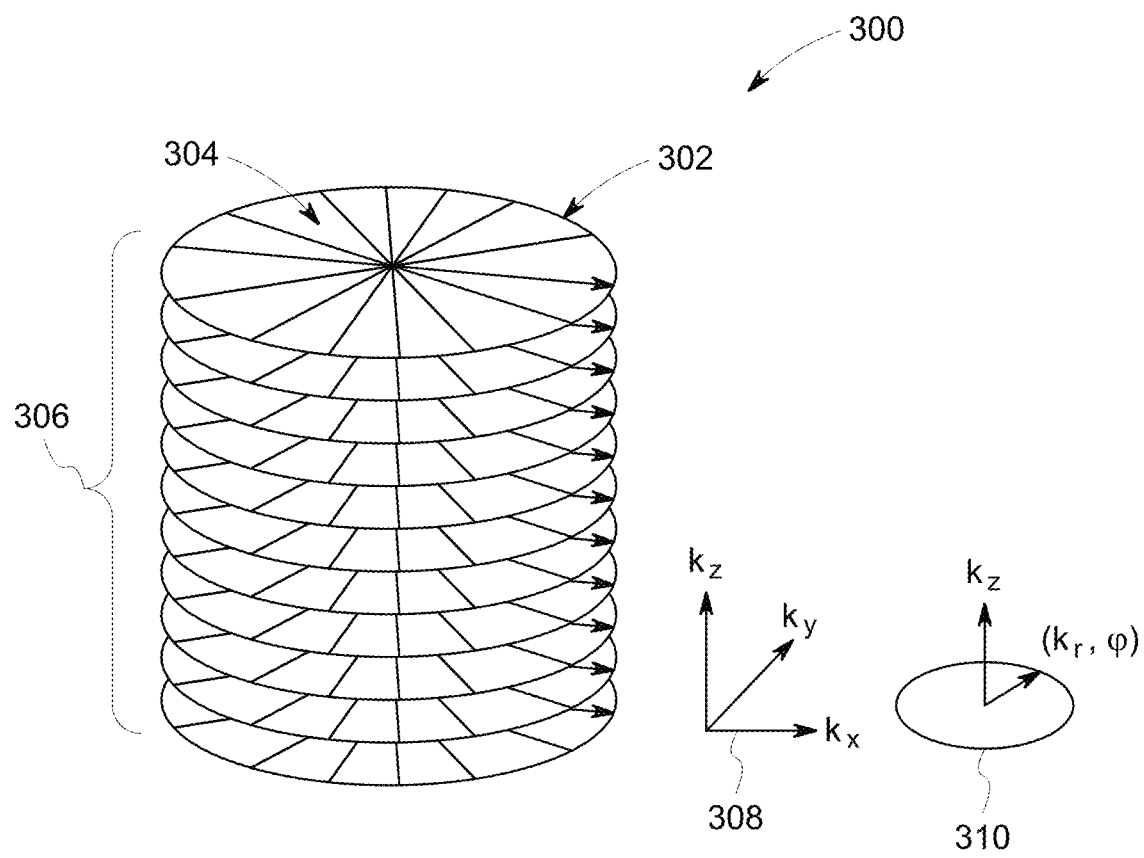
FIG. 3 is a schematic diagram depicting a 3D radial k-space trajectory in accordance with an embodiment of the present technique.

The k-space trajectory 200 shown in FIG. 2 is a 2D radial k-space trajectory. FIG. 3 is a schematic diagram depicting a 3D radial k-space trajectory 300 in accordance with an embodiment of the present technique. To acquire the 3D radial k-space trajectory, a cartesian sampling is applied along the z-axis (i.e., gradient signal waveforms 204) and a radial sampling is applied along the x-y plane (i.e., gradient signal waveforms 206 and 208). The radial sampling along the x-y plane results in a layer of 302 of radial k-space spokes 304. Each layer 302 represents 2D radial layer and is similar to the 2D radial k-space trajectory 200. Further, due to cartesian sampling along the z axis, a plurality of layers of 2D radial k-space spokes create a stack 306. The directions for x, y and z axes relevant to the k-space trajectory 300 are shown by axes representation 308. It should also be noted that since the x-y plane has radial spokes, the x-y plane may also be represented by a k-space spoke radius kr and k-space spoke angle φ as shown in the representation 310. The k-space spoke angle is measured with respect to a predetermined reference k-space spoke, the angle for which is considered as 0 degree.

Figure 4:
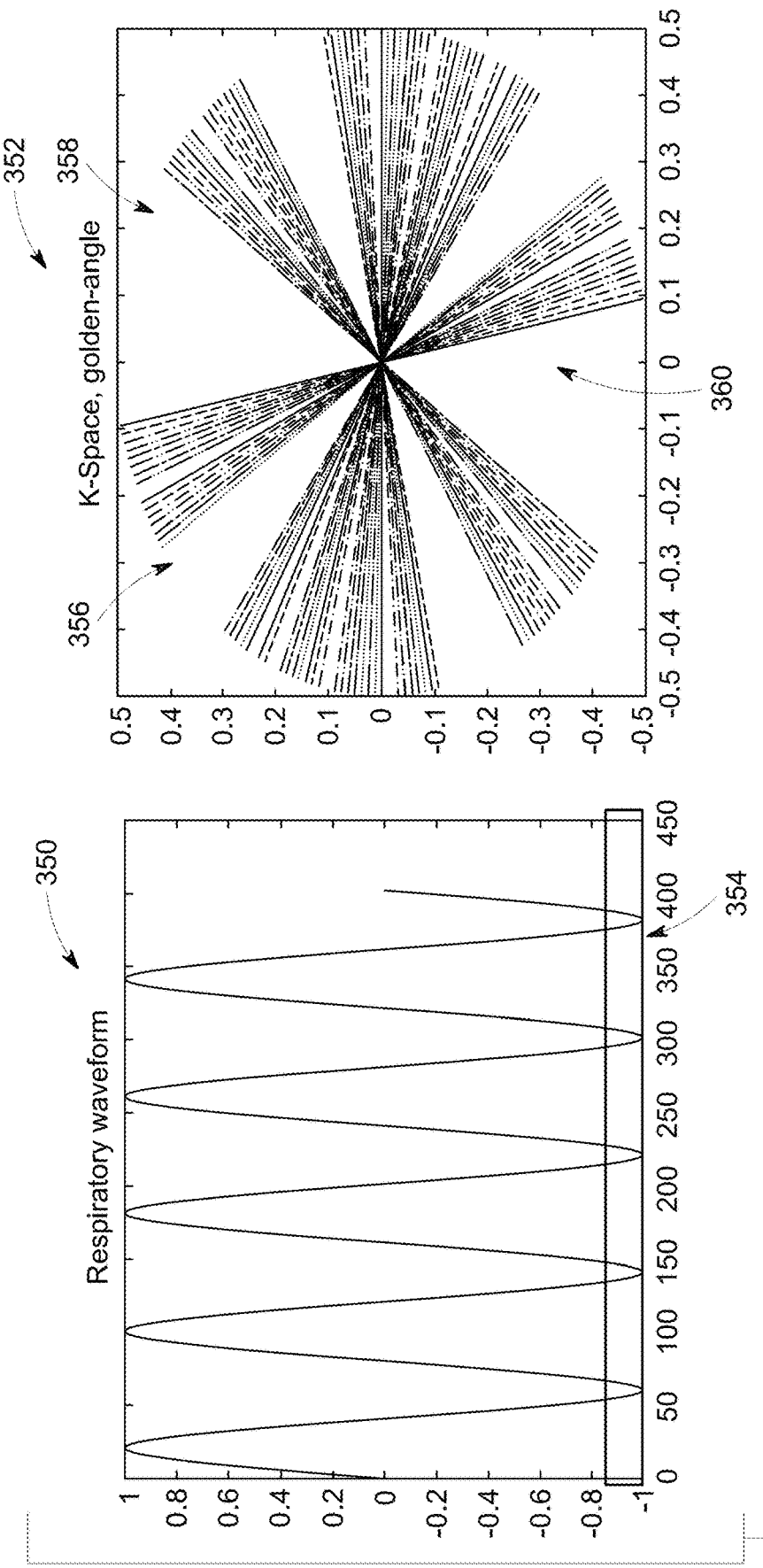
FIG. 4 is a schematic diagram depicting a golden angle view order technique to fill k-space based on a respiratory signal waveform.

As discussed earlier there are multiple ways to fill k-space spokes each layer 302 of the k-space 300 and the corresponding sequence is called a view order. The view order affects the motion artifacts in the final image. FIG. 4 shows a conventional golden angle view order technique to fill k-space based on a respiratory signal waveform. As will be appreciated by those skilled in the art, the respiratory signal shows the patient motion. FIG. 4 shows a plot 350 of a respiratory signal and a k-space layer 352 acquired with the golden angle view order technique. For demonstration purposes, a respiratory window 354 for the respiratory waveform is shown. It is then assumed that all the k-space spokes that are acquired within this preset respiratory window will have similar motion state whereas other k-space spokes corresponding to other respiratory waveform will have different motion state. The k-space spokes falling in the preset respiratory window/motion state are then given higher weight and remaining k-space spokes are penalized (given lower weight) which is referred to as soft gating or discarded (i.e., weight=0) which is referred to as hard gating. As golden angle view order technique samples k-space almost evenly for any given number of spokes, it is generally expected that spokes with similar motion states are distributed almost evenly across k-space. However, because the breathing pattern changes significantly from one patient to another, even distribution of spokes with similar motion states cannot be guaranteed and many a times there are large gaps in the k-space e.g., gaps 356, 358 and 360 in k-space 352. Note that hard gating is illustrated in k-space 352, i.e., spokes with motion state not falling in the preset respiratory window 354 are discarded. Although no gaps occur in soft-gating techniques, severe artifacts still occur in the image due to corrupted spatial frequencies in k-space due to motion. The present technique solves this problem by estimating motion state of each spoke or a subset of spokes in real time and adjusting the view order on the fly i.e., in real time. This results in spokes with similar motion state being distributed evenly in k-space avoiding large gaps as well as corrupted spatial frequencies in the k-space.

Figure 5A:
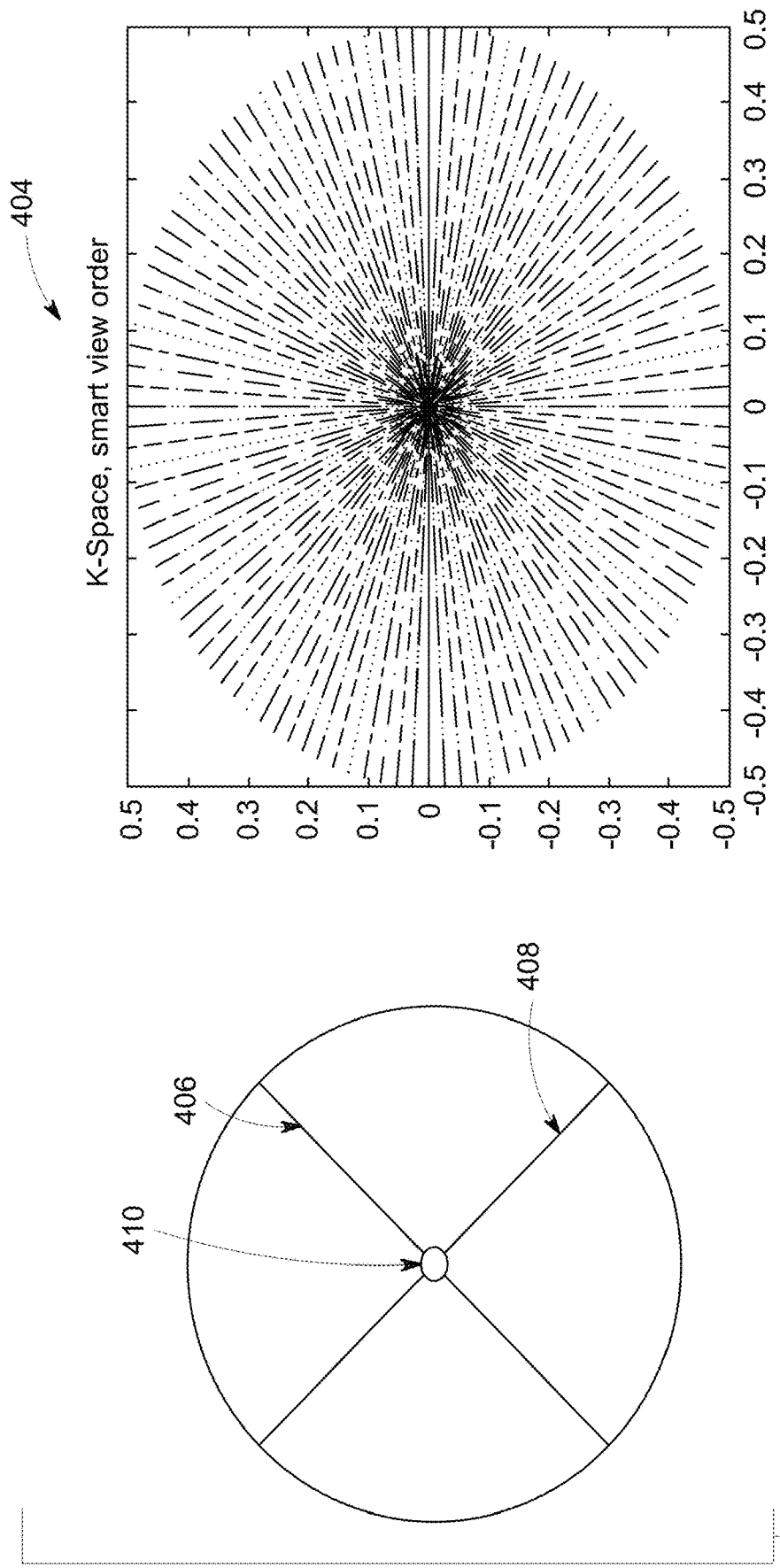
FIG. 5A is a schematic diagram of a process of acquiring k-space spokes for the radial k-space trajectory, in accordance with an embodiment of the present technique.

FIG. 5A depicts the process of acquiring k-space spokes for the radial k-space trajectory in accordance with an embodiment of the present technique. Specifically, FIG. 5A shows a layer 402 which depicts sequence of acquiring k-space spokes and a final k-space layer 404 obtained in accordance with a smart view order technique presented herein. In this technique, the motion state of each spoke is determined from the k-space spoke data itself and based on the motion real time adjustments to the view order are made as will be explained below.

First a k-space spoke 404 from the layer 402 is acquired. For the 3D k-space, k-space spokes in other layers having same k-space angle as the k-space spoke 406 are then acquired. In general, in the radial k-space trajectory, all the k-space spokes in one layer go through the center of the k-space of that layer. For example, in the layer 402 shown in FIG. 5A, k-space spokes 406 and 408 pass through a center 410. Similarly, for the other layers (not shown), k-space spokes pass through a center of the corresponding layer.

As will be appreciated by those skilled in the art, the center of the k-space has a unique property. The center of the k-space basically provides a good indication about the image. If all the center of the k-space points for spokes with same angle for a 3D k-space are represented in a vector form and Fourier transform of that vector is taken, it would provide a profile of the image (image profile) along slice direction or z direction. The exact same image profile can be obtained from the spokes with a different angle if there is no motion in between. So, this image profile can be used to determine how the patient motion is changing along slice direction during acquisition.

The present technique utilizes this unique property of the k-space center to determine the patient motion. Specifically, a subset of k-space spokes is acquired. The subset may include either one k-space spoke or more than one k-space spokes for each layer. If a center of mass of the image profile for the subset of k-space spokes is different than a center of mass of the image profile for the previous subset of k-space spokes, then it is determined that the patient motion has occurred.

In one embodiment, the motion detection includes dimension reduction process. As will be appreciated by those skilled in the art, the dimension reduction involves transforming the multi-dimensional data (e.g., data from multiple receiver channels) into the data which has reduced dimensions such as single-dimension data or a single quantity measurement that still retains the unique property of the original data. For example, in FIG. 5, a principal component analysis (PCA) may be operated on the multi-channel data of spoke 406 to reduce the original data of k-space spokes 406 into a single channel data. Then, center of mass of the profile can be calculated on this single channel data to further reduce dimension into a single value—motion quantification number. Now if the motion quantification number varies for the next subset of k-space acquisition then it is determined that the motion has occurred.

Figure 5B:
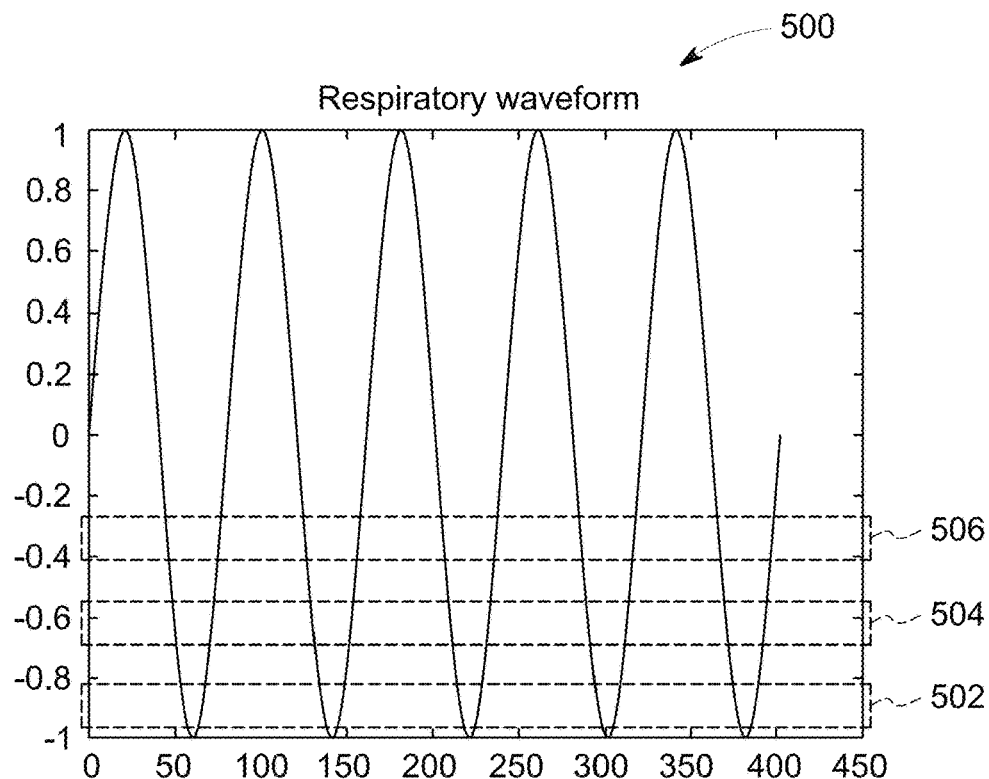
FIG. 5B is a schematic diagram of a respiratory signal plot with three motion states in accordance with an embodiment of the present technique

Generally, an initial set of k-space spokes are acquired in the beginning of each scan either to bring MR signal to steady-state or this set of data can be used as calibration data to calculate coil sensitivity profiles or correct for gradient system imperfections. In this proposed method, this initial set of spokes data is used to extract information about patient's breathing pattern, such as how fast the patient is breathing and peak-to-peak signal variation of breathing motion. The breathing pattern can be extracted from this data by calculating center of mass of image profile for each spoke in this calibration data. Other signal processing techniques such as manifold learning may also be used to extract information about patient's breathing pattern from the initial set of k-space spokes. After the breathing pattern is extracted, this breathing cycle i.e., respiratory signal waveform is divided into a number of motion states where later spokes (i.e., main acquisition spokes which are actually used in image reconstruction) are grouped into. The total number of motion states can be preset or can be set based on the patient's breathing pattern. As an example, FIG. 5B shows a respiratory signal plot 500 and a total number of three motion states 502, 504, and 506 based on the initial set of spokes that is acquired. Each of these motion states represent a range of motion quantification number associated therewith. For example, motion state 502 may represent 0 to 10% motion quantification number. Motion state 504 may represent 10 to 20% and motion state 506 may represent 20 to 30% motion quantification number. As acquisition parameters such as repetition time TR and the total number of main acquisitions spokes are already set, the number of spokes that will be grouped into each motion state can be calculated.

Referring back to FIG. 5A, once the acquisition of main acquisition spokes starts and the first k-space spoke 406 is acquired. The process then involves determining the motion quantification number for that k-space spoke 406. This motion quantification number will be used to adjust spoke angle for the spoke that is going to be acquired next. Specifically, based on the motion quantification number of the k-space spoke 406, the motion state of the patient on the respiratory waveform can be determined. Based on the motion state, spoke angle of the next spoke will be adjusted such that it is going to fill the largest gap in K-space that correspond to its' motion state. Thereafter, the second k-space spoke 408 is acquired and the motion quantification number for k-space spoke 408 is also determined which will be used to adjust spoke angle of the next spoke and so on. Therefore, k-space spokes corresponding to same motion quantification number are distributed as evenly as possible in k-space. Depending on patient's breathing pattern, the distribution might not be as even as desired. However, it would still provide a more even distribution compared to conventional view ordering methods, thus, image quality will be improved.

The k-space spokes with similar motion are then evenly distributed across k-space layer as shown in layer 404. In other words, for all the k-space spokes having similar motion quantification number, the respective k-space spokes acquired are distributed evenly across the layer 404 of the k-space while filling the k-space. Thus, if there are 3 motion states during acquisition of all the k-space spokes as shown in FIG. 5B then there will be 3 even distributions of k-space spokes in layer 404. Distributing spokes with similar amount of motion evenly across the k-space guarantees that corrupted (or lost) high spatial frequency signals due to motion are not localized. This avoids large gaps in the k-space as shown by layer 404 as against layer 352 of FIG. 4.

Figure 6:
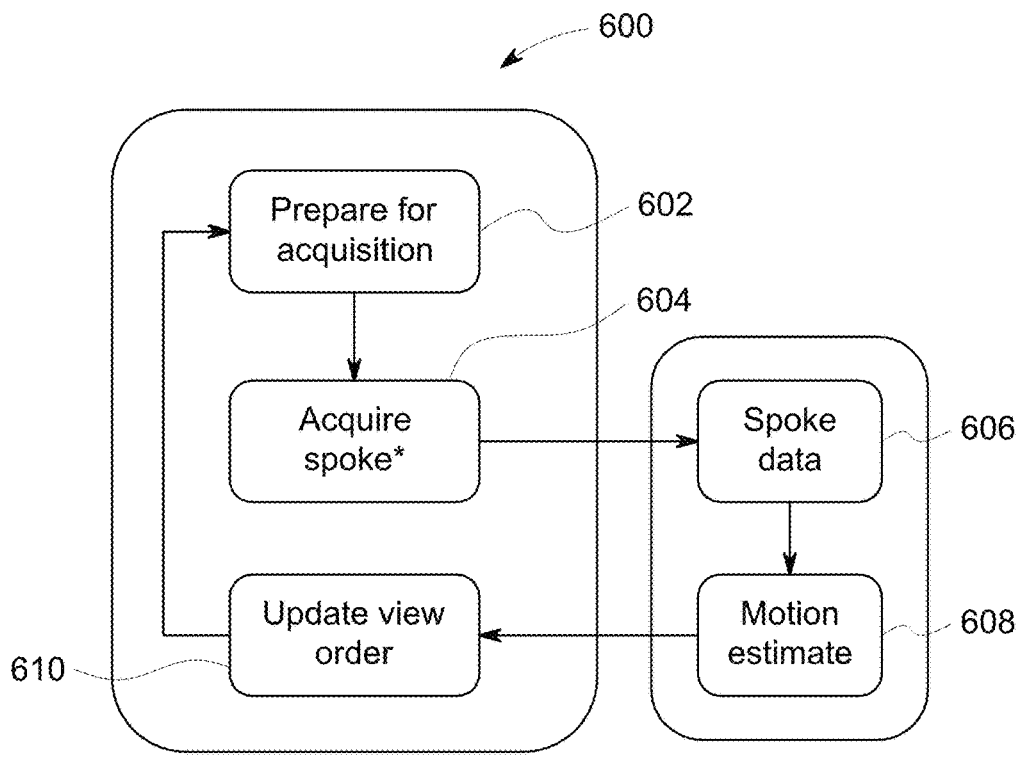
FIG. 6 is a flow chart diagram of a smart view ordering technique, in accordance with an embodiment of the present technique.

FIG. 6 shows a flow chart 600 of smart view ordering technique according to an embodiment of the present technique. It should be noted that the steps of flowchart 600 may be implemented by the MRI controller 33 of FIG. 1. Specifically, at step 602, the MRI system is prepared for MR signal acquisition. This may include defining a view order that decides the gradient pulse signal that needs to be applied to acquire the next k-space spoke. At step 604, the gradient signals are applied to acquire the desired k-space spoke. The spoke data from the acquired k-space spoke is then processed at step 606 to estimate the motion 608. Estimating the motion may include processing the k-space spoke data as described earlier and determining corresponding motion quantification number. The quantification number may be compared with the previous k-space motion quantification number to see if any motion has occurred. If the motion has occurred then the new motion state on the respiratory waveform is determined. At step 610, the motion estimate 608 and corresponding motion state is used to update the view order. If the motion has not occurred, then the preset view order at 602 will not be changed. However, if motion has occurred between the acquisition of 2 k-space spokes then the new view order based on the new motion state will be prepared in step 610. The updated view order will be then provided back to step 602 for next acquisition.

Figure 7:
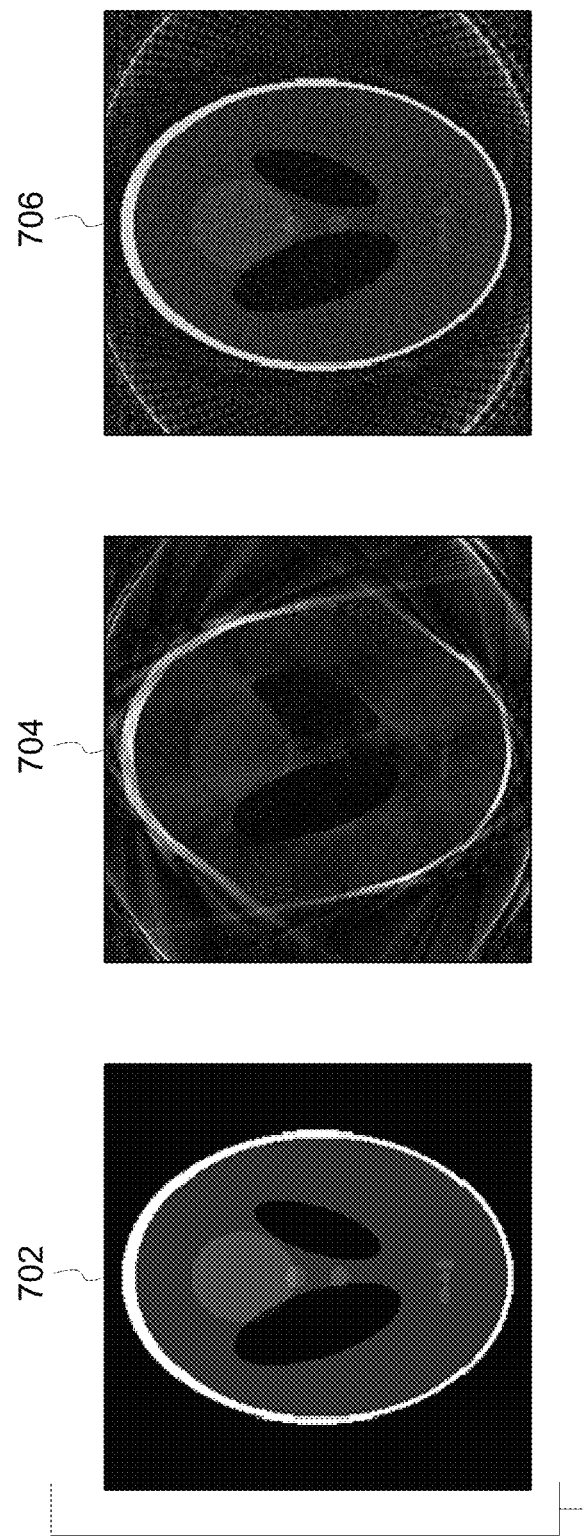
FIG. 7 is a schematic diagram depicting comparison of object images obtained with the golden angle view order technique and smart view order technique obtained in accordance with an embodiment of the present technique.

FIG. 7 shows comparison of object images obtained with the golden angle view order technique and smart view order technique obtained in accordance with an embodiment of the present technique. Specifically, FIG. 7 shows an original image 702 and image 704 which is generated after reconstructing the k-space 352 (FIG. 4) that was obtained with the golden angle view order technique. Further FIG. 7 shows an image 706 which is generated after reconstructing the k-space 404 (FIG. 6) that was obtained with the smart view order technique presented herein. It can be seen that a lot of image details from original image 702 are lost in image 704 due to big gaps in k-space 352. It is not straightforward to recover these lost image details even with advanced reconstruction methods such as the ones utilizing deep learning.

In comparison, the image details in image 706 haven't been lost that much. There may be some artifacts in image 706 which are more incoherent and can be reduced significantly with reconstruction methods such as parallel imaging, deep learning techniques.

Figure 8:
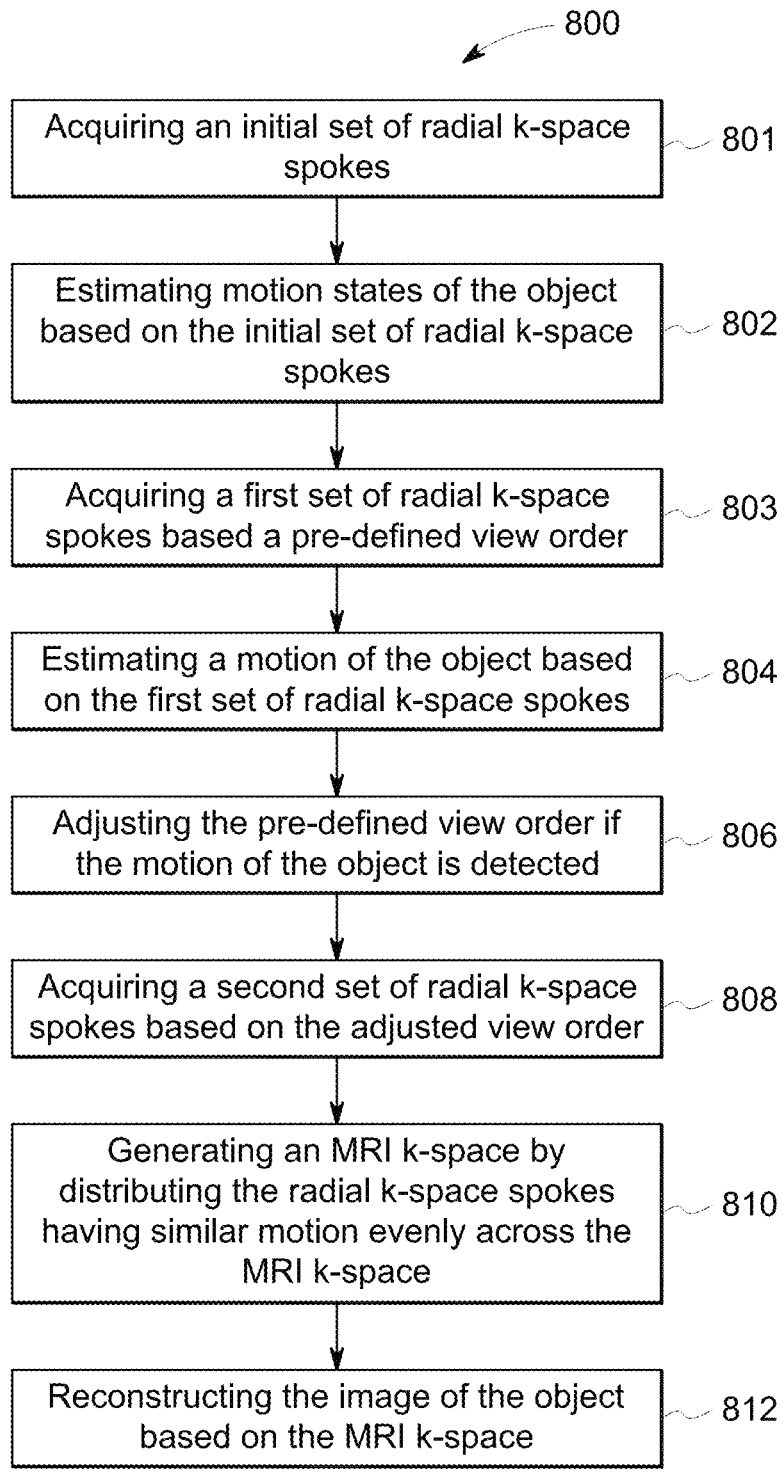
FIG. 8 is a flowchart of a method for generating MR image of an object with a MRI system, in accordance with an embodiment of the present technique.

FIG. 8 is a flowchart of a method 800 for generating MR image of an object with a MRI system 10 according to an embodiment of the present technique. It should be noted that the method 800 may be implemented by the MRI controller 33 of FIG. 1. At step 801, the method includes acquiring an initial set of radial k-space spokes. In one embodiment, the k-space acquired to bring MR signal to a steady-state or a calibration k-space (undersampled or having low resolution) can be used as an initial set of radial k-space spokes. Based on the initial set of radial k-space spokes, at step 802, the breathing cycle i.e., respiratory signal of the patient is divided into a number of motion states as shown in FIG. 5B where later k-space spokes will be grouped into. At step 803, the method includes acquiring a first set of radial k-space spokes based on a pre-defined view order. The pre-defined view order may be determined based on initial set of radial k-space spokes. In general, the method employs radial sampling method to acquire radial k-space spokes. The radial sampling method may include at least one of a stack of star radial sampling method, a radial Single-Shot Fast Spin Echo (SSFSE) method, a radial Echo-Planar Imaging (EPI) method, 3D stack of periodically rotated overlapping parallel lines with enhanced reconstruction (PROPELLLER), 3D stack of spirals, or any other 3D radial sampling method.

At step 804, the method includes estimating a motion of the object based on the first set of radial k-space spokes. In one embodiment, estimating the motion of the object includes determining a center of mass of at least one radial k-space spoke of the first set of radial k-space spokes. It should be noted that the object motion need not be determined from each of the radial k-space spokes as the object motion does not change for every radial spoke acquisition. Therefore, instead of determining motion for each radial spoke, in some embodiments, the motion state is determined only after a plurality of radial spokes are acquired from the first set.

In one embodiment, estimating the motion of the object comprises determining a motion quantification number for the at least one radial k-space spoke based on a dimension reduction process. The dimension reduction process comprises operating a principal component analysis (PCA) on the multi-channel data of the at least one radial k-space spoke to reduce the original data of k-space spokes into a single channel data. Then, the center of mass can be calculated on this single channel data to further reduce dimension into the motion quantification number. The PCA is then operated on the center of mass to generate the motion quantification number.

If the object motion is detected at step 804 then at step 806, the method includes adjusting the pre-defined view order. Adjusting the pre-defined view order includes determining which k-space spoke to acquire next. In one embodiment, the adjusted pre-defined view order is called as a smart view order. In general, the motion quantification number determined in step 804 is used to adjust spoke angle for the spoke that is going to be acquired next. Once the pre-defined view order is adjusted, at step 808, a second set of radial k-space spokes is acquired based on the adjusted view order. Further, at step 810, the MRI k-space is filled or generated by distributing the radial k-space spokes having similar motion evenly across the MRI k-space. In other words, MRI k-space spokes having similar motion quantification number may be distributed evenly in the radial k-space and so at step 810, final radial k-space gets generated. It should be noted that the acquisition of k-space spokes and filling them in the k-space continues till all the k-space spokes are acquired i.e., till the whole object scan is completed. Once the complete k-space is filled or generated then at step 812, the image of the object is reconstructed based on the final k-space. It should also be noted that the object image may further be improved by using deep learning (DL) techniques to remove any image artifacts.

One of the advantages of the present technique is that it provides superior image quality especially for fast imaging where k-space is undersampled. Further, the technique uses already acquired k-space spokes for both motion detection and k-space formation and thus, the technique reduces the need for repeat scans and improves scanner efficiency. Moreover, this technique can be used in conjunction with the existing DL techniques to further improve the image quality.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

The invention claimed is:

1. A method for generating an image of an object with a magnetic resonance imaging (MRI) system, the method comprising:
   acquiring an initial set of radial k-space spokes;
   estimating a plurality of motion states of the object based on the initial set of radial k-space spokes;
   acquiring a first set of radial k-space spokes based on a pre-defined view order sequence;
   estimating a motion of the object based on the first set of radial k-space spokes;
   adjusting the pre-defined view order if the motion of the object is detected; and
   acquiring a second set of radial k-space spokes based on the adjusted pre-defined view order;
   generating an MRI k-space by distributing the radial k-space spokes having similar motion evenly across the MRI k-space; and
   reconstructing the image of the object based on the MRI k-space.

2. The method of claim 1, wherein at least one of i) a k-space acquired for bringing a MR signal of the MRI system to a steady-state or ii) a calibration k-space acquired for calculating coil sensitivity profiles of the MRI system or iii) a gradient correction k-space acquired for correcting gradient system imperfections of the MRI system is used as the initial set of radial k-space spokes.

3. The method of claim 1, wherein estimating the plurality of motion states of the object comprises dividing a respiratory signal waveform of the object into a number of states based on a breathing pattern of the object.

4. The method of claim 3, wherein the breathing pattern of the object is determined by calculating a center of mass of an image profile for each radial k-space spoke in the initial set of radial k-space spokes.

5. The method of claim 1, wherein the first set of radial k-spokes and the second set of radial k-spokes are acquired with a three dimensional (3D) stack of star radial sampling method, a 3D radial Single-Shot Fast Spin Echo (SSFSE) method, a 3D radial Echo-Planar Imaging (EPI) method, a 3D stack of periodically rotated overlapping parallel lines with enhanced reconstruction (PROPELLER), a 3D stack of spirals method or a 3D MR sequence where a 3D trajectory includes a stack of 2D trajectories.

6. The method of claim 1, wherein estimating the motion of the object comprises determining a center of mass of at least one radial stack of k-space spokes of the first set of radial k-space spokes.

7. The method of claim 6, wherein estimating the motion of the object further comprises detecting the motion if the center of mass of the at least one radial stack of k-space spoke is different than the center of mass of a preceding stack of radial k-space spoke.

8. The method of claim 6, wherein determining the center of mass of the at least one radial k-space spoke comprises determining a motion quantification number for the at least one radial k-space spoke based on a dimension reduction process.

9. The method of claim 8, wherein the dimension reduction process comprises determining applying a principal component analysis (PCA) to the at least one radial k-space spoke to determine the motion quantification number.

10. The method of claim 9, wherein distributing the radial k-space spokes having similar motion evenly across the MRI k-space comprises distributing the radial k-space spokes having similar motion quantification number.

11. The method of claim 1, wherein adjusting the view order comprises changing a sequence of radial k-space spokes that need to be acquired next.

12. A magnetic resonance imaging (MRI) system, comprising:
a magnet configured to generate a polarizing magnetic field about at least a portion of an object arranged in the MRI system;
a gradient coil assembly including a readout gradient coil, a phase gradient coil, a slice selection gradient coil configured to apply at least one gradient field to the polarizing magnetic field;
a radio frequency (RF) system configured to apply an RF field to the object and to receive magnetic resonance signals from the object;
a processing system programmed to:
acquire an initial set of radial k-space spokes;
estimate a plurality of motion states of the object based on the initial set of radial k-space spokes;
acquire a first set of radial k-space spokes based on a pre-defined view order sequence;
estimate a motion of the object based on the first set of radial k-space spokes;
adjust the pre-defined view order if the motion of the object is detected;
acquire a second set of radial k-space spokes based on the adjusted pre-defined view order;
generate an MRI k-space by distributing the radial k-space spokes having similar motion evenly across the MRI k-space; and
reconstruct the image of the object based on the MRI k-space.

13. The MRI system of claim 12, wherein at least one of a i) k-space acquired for bringing a MR signal of the MRI system to a steady-state or ii) a calibration k-space acquired for calculating coil sensitivity profiles of the MRI system or iii) a gradient correction k-space acquired for correcting gradient system imperfections of the MRI system is used as the initial set of radial k-space spokes.

14. The system of claim 12, wherein the processing system is programmed to estimate the plurality of motion states of the object by dividing a respiratory signal waveform of the object into a number of states based on a breathing pattern of the object.

15. The system of claim 14, wherein the breathing pattern of the object is determined by calculating a center of mass of an image profile for each radial k-space spoke in the initial set of radial k-space spokes.

16. The MRI system of claim 12 wherein the first set of radial k-spokes and the second set of radial k-spokes are acquired with a three dimensional (3D) stack of star radial sampling method, a 3D radial Single-Shot Fast Spin Echo (SSFSE) method, a 3D radial Echo-Planar Imaging (EPI) method, a 3D stack of periodically rotated overlapping parallel lines with enhanced reconstruction (PROPELLER) or a 3D stack of spirals method or a 3D MR sequence where a 3D trajectory includes a stack of 2D trajectories.

17. The MRI system of claim 12, wherein the processing system is programmed to estimate the motion of the object by determining a center of mass of at least one radial k-space spoke of the first set of radial k-space spokes.

18. The MRI system of claim 17, wherein the processing system is programmed to estimate the motion of the object by detecting the motion if the center of mass of the at least one radial k-space spoke is different than the center of mass of a preceding radial k-space spoke.

19. The MRI system of claim 17, wherein the processing system is programmed to determine the center of mass of the at least one radial k-space spoke by determining a motion quantification number for the at least one radial k-space spoke based on a dimension reduction process.

20. The MRI system of claim 19, wherein the dimension reduction process comprises determining applying a principal component analysis (PCA) to the at least one radial k-space spoke determine the motion quantification number.

21. The MRI system of claim 20, wherein the processing system is programmed to distribute the radial k-space spokes having similar motion evenly across the MRI k-space by distributing the radial k-space spokes having similar motion quantification number.

22. A method for generating an image of an object with a magnetic resonance imaging (MRI) system, the method comprising:
estimating a plurality of motion states of the object based on an initial set of radial k-space spokes;
acquiring MRI radial k-space spokes for generating a MRI k-space;
estimating a motion of the object from at least one of the MRI radial k-space spokes;
adjusting a view order of acquiring the MRI radial k-space spokes based on the detected motion of the object;
generating the MRI k-space by distributing the radial MRI k-space spokes having similar motion evenly across the MRI k-space; and
reconstructing the image of the object based on the MRI k-space.

* * * * *